(12) United States Patent
Shin

(10) Patent No.: US 8,040,196 B2
(45) Date of Patent: Oct. 18, 2011

(54) DIGITALLY CONTROLLED OSCILLATOR

(75) Inventor: Jong-shin Shin, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 76 days.

(21) Appl. No.: 12/570,144

(22) Filed: Sep. 30, 2009

(65) Prior Publication Data

US 2010/0090771 A1    Apr. 15, 2010

(30) Foreign Application Priority Data

Oct. 9, 2008    (KR) .................. 10-2008-0099348

(51) Int. Cl.
    *H03K 3/03*    (2006.01)
(52) U.S. Cl. ...................... 331/57; 331/177 R
(58) Field of Classification Search .............. 331/57, 331/177 R, 177 V, 34, 36 C, 179
    See application file for complete search history.

(56) References Cited

U.S. PATENT DOCUMENTS

2008/0252387 A1* 10/2008 Higashi ........................ 331/57
2008/0284529 A1* 11/2008 Refeld et al. .................. 331/57

FOREIGN PATENT DOCUMENTS

| JP | 07-074592 | 3/1995 |
| JP | 2000-068787 | 3/2000 |
| KR | 100246341 B1 | 6/1999 |
| KR | 1020070025137 A | 3/2007 |

* cited by examiner

*Primary Examiner* — Ryan Johnson
(74) *Attorney, Agent, or Firm* — Volentine & Whitt, PLLC

(57) ABSTRACT

A digitally controlled oscillator includes a ring oscillator, a parallel resistor bank connected to a first terminal of the ring oscillator and having a resistance that varies according to a digital code, and a serial resistor bank connected to a second terminal of the ring oscillator and having a resistance that varies according to the digital code. A frequency of the ring oscillator linearly varies with a variation in the resistance of the parallel resistor bank and the resistance of the serial resistor bank according to the digital code.

6 Claims, 4 Drawing Sheets

DIGITALLY CONTROLLED OSCILLATOR

CROSS-REFERENCE TO RELATED APPLICATIONS

A claim of priority is made to Korean Patent Application No. 10-2008-0099348, filed Oct. 9, 2008, in the Korean Intellectual Property Office, the disclosure of which is incorporated herein in its entirety by reference.

BACKGROUND

The inventive concepts described herein generally relate to oscillators, and more particularly, the invention concepts relate to digitally controlled oscillators.

Generally, a digitally controlled oscillator (DCO) must have a relatively wide tuning range in order to execute digital automatic frequency calibration of a phase locked loop (PLL) or a voltage controlled oscillator (VCO) of a wide operating range.

In the meantime, when frequency is controlled in a ring oscillator type DCO using a digital-to-analog converter (DAC) and a current starved transistor, a transistor used for a current source has a size that is significantly larger than a transistor used for a ring oscillator, and it is difficult to obtain a wide tuning range of about 2 decades.

In an effort to obtain an oscillator of a wide tuning range, a resistor or a capacitor may be switched according to a digital code. In this case, a frequency output from the oscillator varies generally along a 1/x curve since the frequency is inversely proportional to the resistance and the capacitance. If the frequency varies nonlinearly, the resolution of the frequency, which varies with the digital code, is degraded.

SUMMARY

According to an aspect of the inventive concept, a digitally controlled oscillator includes a ring oscillator, a parallel resistor bank connected to a first terminal of the ring oscillator and having a resistance that varies according to a digital code, and a serial resistor bank connected to a second terminal of the ring oscillator and having a resistance that varies according to the digital code. A frequency of the ring oscillator linearly varies with a variation in the resistance of the parallel resistor bank and the resistance of the serial resistor bank according to the digital code.

According to another aspect of the inventive concept, a digitally controlled oscillator includes a ring oscillator, a resistor bank connected to a first terminal of the ring oscillator and having a resistance that varies according to a digital code, and a capacitor bank connected to a second terminal of the ring oscillator and having impedance that varies according to the digital code. A frequency of the ring oscillator linearly varies with a variation in the resistance of the resistor bank and the impedance of the capacitor bank according to the digital code.

BRIEF DESCRIPTION OF THE DRAWINGS

The above and other aspects of the inventive concepts described herein will become readily apparent from the detailed description that follows, with reference to the accompanying drawings, in which.

DETAILED DESCRIPTION OF THE EMBODIMENTS

Figure 1A:
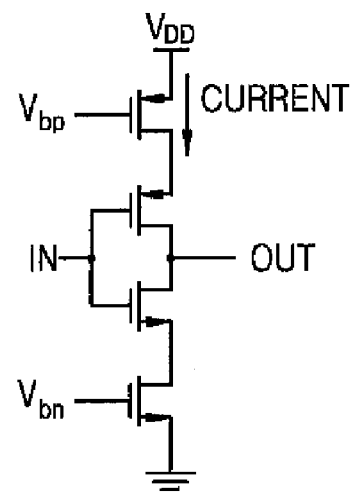
FIGS. 1A, 1B and 1C are circuit diagrams of a current based inverter, a C-based inverter, and an R-based inverter, respectively.

The inventive concepts will now be described more fully with reference to the accompanying drawings, in which exemplary embodiments of the inventive concept are shown. The inventive concepts may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals in the drawings denote like elements, and thus their description will not be repeated.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Figure 1B:
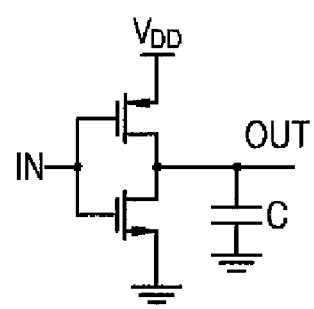
Figure 1C:
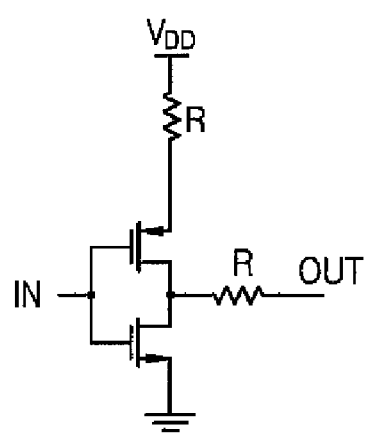

FIGS. 1A, 1B and 1C are circuit diagrams of a current based inverter, a C-based inverter, and an R-based inverter, respectively, each of which may be employed in an oscillator.

The current based inverter illustrated in FIG. 1A includes first and second serially connected transistors of different polarities each gated to an input IN, and an current source transistors receiving bias voltages Vbp and Vbn. The current based transistors of this type can obtain a wide tuning range relative to the output OUT only with sufficiently large current source transistors to which bias voltages Vbp and Vbn are respectively applied.

In the C-based inverter of FIG. 1B includes first and second serially connected transistors of different polarities each gated to an input IN, and a capacitance C connected between the output terminal OUT and ground. On the other hand, the R-based inverter includes first and second serially connected transistors of different polarities each gated to an input IN, and resistive elements R connected in the paths of the power supply VDD and output OUT.

In the C-based inverter and the R-based inverter, when a resistance R or capacitance C linearly varies, a frequency varies in a non-linearly manner inversely to the resistance R or capacitance C, and thus it is difficult to obtain a wide tuning range. The frequency variation can maintain linearity if the resistance R or capacitance C varies only slightly, but nonlinearity of the frequency variation increases as a variation in the resistance R or capacitance C increases. In the case of utilizing digital codes in a digitally controlled oscillator (DCO), a control resolution of a digitally controlled oscillator (DCO) decreases when the frequency variations become nonlinear.

Figure 2:
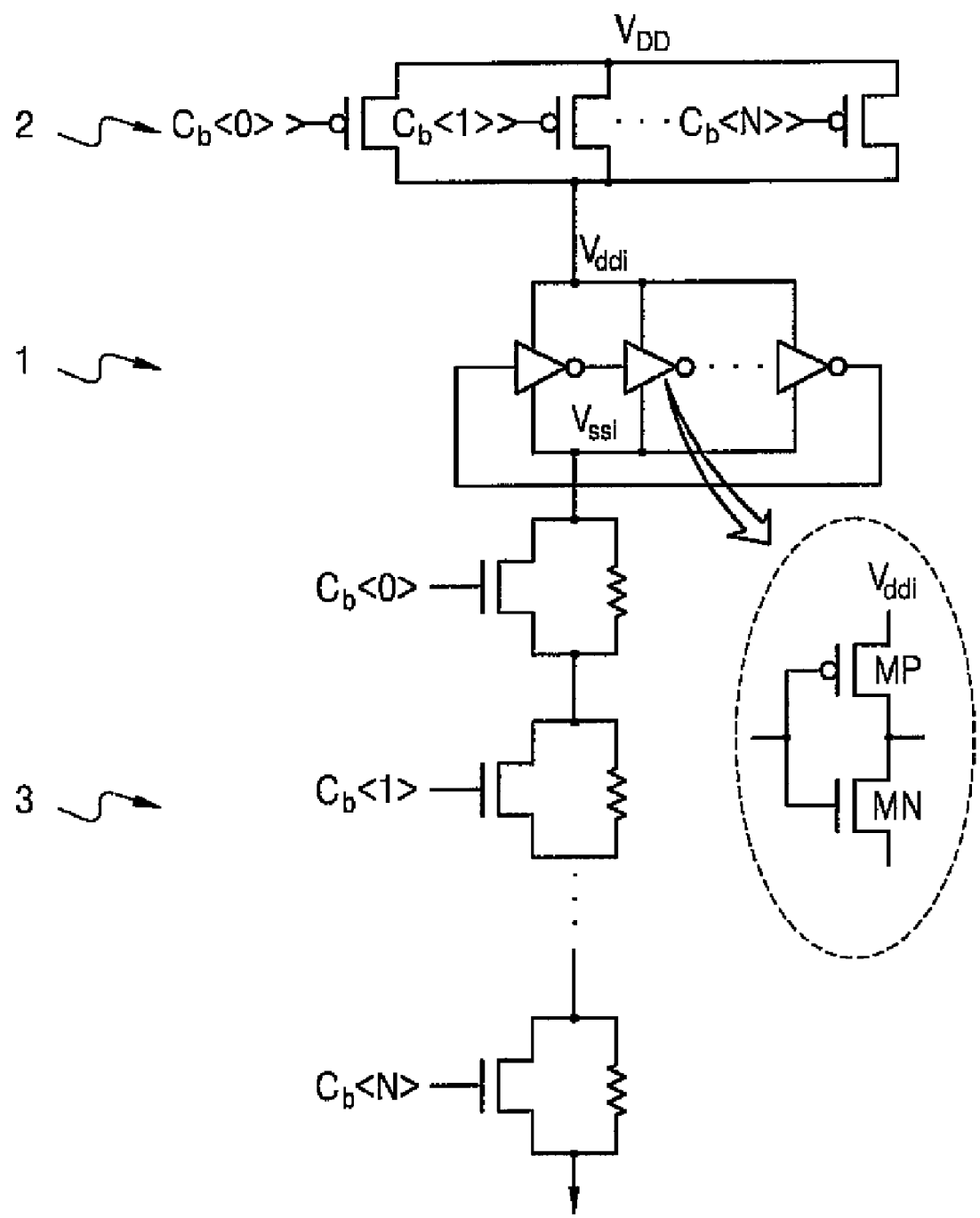
FIG. 2 is a circuit diagram of a digitally controlled oscillator (DCO) according to an embodiment of one or more inventive concepts.

FIG. 2 is a circuit diagram of a DCO according to an embodiment of one or more inventive concepts described herein. As shown, the DCO of the example of FIG. 2 includes a ring oscillator 1, a parallel resistor bank 2 and a serial resistor bank 3.

The ring oscillator 1 of FIG. 2 includes a current-based inverter such as that illustrated in FIG. 1A, where the current sources are respectively implemented by the parallel resistor bank 2 and the serial resistor bank 3 of FIG. 2.

The parallel resistor bank 2 forms resistance Rp and, in this example, includes a plurality (n=N+1) of p-type metal-oxide semiconductor (PMOS) transistors connected in parallel and respectively driving by signal bits Cb<0> through Cb<N> of an input digital code C. Also, in the example of this embodiment, a channel width W of each of n-th PMOS transistor is half the size of each (n+1)-th PMOS transistor. For example, the channel width W of the PMOS transistor receiving signal bit Cb<1> is twice the channel width W of the PMOS transistor receiving signal bit Cb<0>. The resistance Rp of the parallel resistor bank 2 adjusts a total transconductance Gmp of a plurality of p-type metal-oxide semiconductor (PMOS) transistors MPs included in the inverters forming the ring oscillator 1.

The serial resistor bank 3 forms resistance Rn and, in this example, includes a plurality (n=N+1) of resistive elements connected in series, with a plurality (n=N+1) of n-type metal-oxide semiconductor (NMOS) transistors connected across the respective resistors and respectively driving by signal bits Cb<0> through Cb<N> of the input digital code C. Also, in the example of this embodiment, a resistance of each n-th resistor transistor is half that of each (n+1)-th resistor. For example, the resistance of the resistor connect to the transistor receiving signal bit Cb<1> is twice the resistance of the resistor connected to the NMOS transistor receiving signal bit Cb<0>. The resistance Rn of the parallel resistor bank 2 adjusts a total transconductance Gmn of a plurality of n-type metal-oxide semiconductor (NMOS) transistors MNs included in the inverters forming the ring oscillator 1.

The average of the transconductances Gmp of the MPs and the transconductances Gmn of the MNs corresponds to the total transconductance Gm. Gmp corresponds to gmp/(1+gmpRp) and Gmn corresponds to gmn/(1+gmnRs). Here, gmp is the transconductance of a single PMOS transistor MP and gmn is the transconductance of a single NMOS transistor MN included in each of the inverters. It is assumed that the sizes of the PMOS transistor MP and the NMOS transistor MN are determined such that gmp=gmn=gm, wherein gm denotes a value being identical with gmp and gmn. The DCO has a higher frequency as the parallel resistance Rp or the serial resistance Rs decreases, and thus the frequency increases as a control code increases if the DCO has a small resistance while a resistance control code is large. The parallel resistance Rp decreases along a 1/x curve and the serial resistance Rs decreases along a straight line having a gradient −x as the digital code increases. For example, if the digital code has 5 bits and unit resistance of a transistor is ΔR, the parallel resistance Rp becomes 32ΔR/x and the serial resistance becomes ΔR(33−x). When the parallel resistance Rp and the serial resistance Rs which vary with the digital code are applied to the parallel resistor bank 2 and the serial resistor bank 3, Gmp and Gmn can be obtained as follows.

$$Gmp = \frac{gm}{1 + gm\frac{32\Delta R}{x}} = gm\frac{x}{x + 32gm\Delta R} \quad \text{Equation 1}$$

-continued
$$Gmn = \frac{gm}{1 + gm\Delta R(33 - x)} = \frac{gm}{1 + 32gm\Delta R - gm\Delta Rx}$$

Here, the frequency is determined as follows.

$$Freq = \frac{1}{2\pi C}\frac{gm}{1 + gm\frac{32\Delta R}{x}} = \frac{gm}{2\pi C}\frac{x}{x + 32gm\Delta R} \quad \text{Equation 2}$$

$$Freq = \frac{1}{2\pi C}\frac{gm}{1 + gm\Delta R(33 - x)}$$
$$= \frac{gm}{2\pi C}\frac{1}{1 + 33gm\Delta R - gm\Delta Rx}$$

The two frequencies of Equation 2 are summed up to determine the frequency of the DCO.

Figure 3:
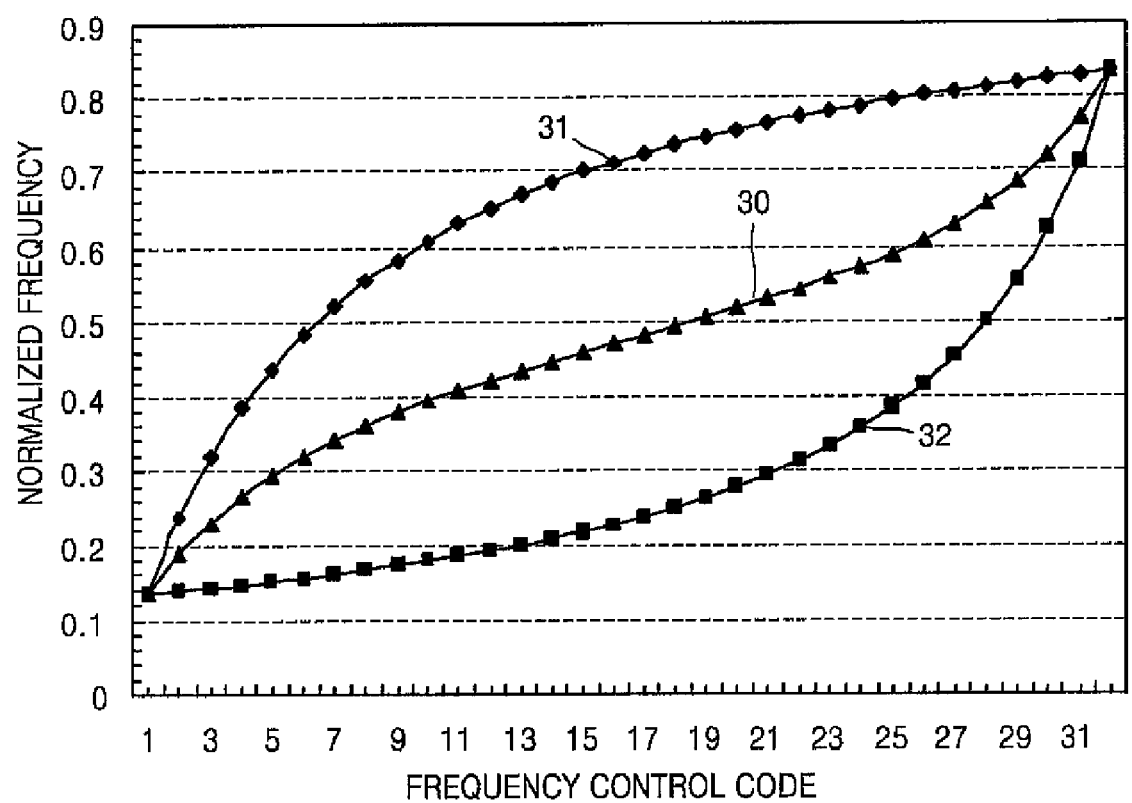
FIG. 3 is a graph illustrating a relationship between a normalized frequency and a frequency control code input to the DCO illustrated in FIG. 2.

FIG. 3 is a graph illustrating a relationship between a normalized frequency and a frequency according to equation 2 with respect to a frequency control code input to the DCO illustrated in FIG. 2. Reference numeral 30 represents the frequency normalized with respect to the frequency control code input to the DCO illustrated in FIG. 2, reference numeral 31 denotes a frequency corresponding to the parallel resistor bank illustrated in FIG. 2 and reference numeral 32 represents a frequency corresponding to the serial resistor bank illustrated in FIG. 2.

Referring to FIG. 3, the curved lines 31 and 32 show that frequency variations considerably vary with respect to a frequency control code variation over ranges other than narrow range portions. In contrast, the curved line 30 shows that a frequency variation with respect to the frequency control code variation is uniform over a range other than both edges of the graph. Accordingly, the frequency corresponding to each frequency control code linearly varies, and thus a high resolution can be obtained.

Figure 4:
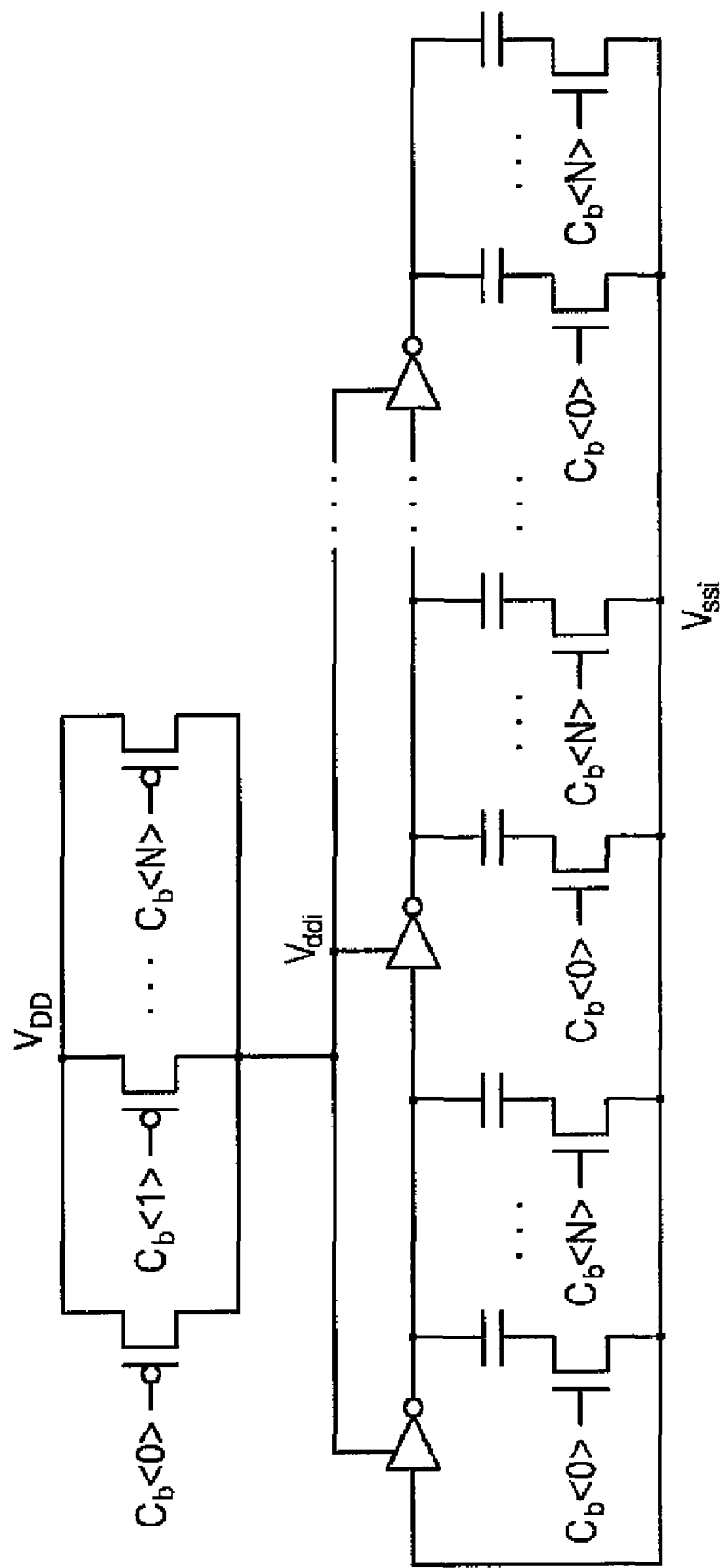
FIG. 4 is a circuit diagram of a DCO according to another embodiment of one or more inventive concepts.

Although the DCO illustrated in FIG. 2 employs resistance banks, one or more capacitor banks can be also used for the DCO. FIG. 4 illustrates an example in which a parallel capacitor bank and a parallel resistor bank are used for a DCO. The impedance of the parallel capacitor bank operates in the same manner as the resistance of the serial resistor bank illustrated in FIG. 2, and thus the same effect can be obtained.

While the inventive concept has been particularly shown and described with reference to exemplary embodiments thereof, it will be understood that various changes in form and details may be made therein without departing from the spirit and scope of the following claims.

What is claimed is:
1. A digitally controlled oscillator comprising:
a ring oscillator;
a parallel resistor bank connected to a first terminal of the ring oscillator and having a resistance that varies according to a digital code; and
a serial resistor bank connected to a second terminal of the ring oscillator and having a resistance that varies according to the digital code,
wherein a frequency of the ring oscillator linearly varies with a variation in the resistance of the parallel resistor bank and the resistance of the serial resistor bank according to the digital code, and
wherein the serial resistor bank comprises a plurality of resistors connected in series, and a plurality of transistors respectively connected across the plurality of resis- tors, wherein an on/off state of the plurality of transistors is controlled by the digital code.

2. The digitally controlled oscillator of claim 1, wherein the parallel resistor bank comprises a plurality of transistors that are connected in parallel, and wherein an on/off state of the plurality of transistors of the parallel resistor bank is controlled by the digital code.

3. The digitally controlled oscillator of claim 2, wherein the on/off state of the plurality of transistors of the parallel resistor bank is controlled by respective signal bits of the digital code.

4. The digitally controlled oscillator of claim 3, wherein the plurality of transistors of the parallel resistor bank includes N+1 transistors, and the digital code includes N+1 signal bits which are respectively applied to the N+1 transistors, and wherein a channel width of each (n+1)-th transistor is twice the channel width of each n-th transistor, where N is an integer of at least one, and n=1 to N+1.

5. The digitally controlled oscillator of claim 1, wherein the on/off state of the plurality of transistors of the serial resistor bank is controlled by respective signal bits of the digital code.

6. The digitally controlled oscillator of claim 5, wherein the plurality of transistors of the serial resistor bank includes N+1 transistors respectively connected across N+1 resistors, and the digital code includes N+1 signal bits which are respectively applied to the N+1 transistors, and wherein a resistance of each (n+1)-th resistor is twice the resistance of each n-th transistor, where N is an integer of at least one, and n=1 to N+1.

* * * * *